United States Patent
Köster et al.

(10) Patent No.: US 11,116,111 B2
(45) Date of Patent: Sep. 7, 2021

(54) METHOD AND ARRANGEMENT FOR AIR-CONDITIONING A COLD AISLE

(71) Applicants: WEISS KLIMATECHNIK GMBH, Reiskirchen (DE); Equinix (EMEA) B.V., Amsterdam (NL)

(72) Inventors: Mathias Köster, Bad Nauheim (DE); Peter Salomon, Waibstadt (DE); Chad McCarthy, Frankfurt am Main (DE)

(73) Assignees: WEISS KLIMATECHNIK GMBH, Reiskirchen (DE); EQUINIX (EMEA) B.V., Amsterdam (NL)

( * ) Notice: Subject to any disclaimer, the term of this patent is extended or adjusted under 35 U.S.C. 154(b) by 48 days.

(21) Appl. No.: 15/520,454

(22) PCT Filed: Nov. 17, 2015

(86) PCT No.: PCT/EP2015/076827
§ 371 (c)(1),
(2) Date: Apr. 20, 2017

(87) PCT Pub. No.: WO2016/079119
PCT Pub. Date: May 26, 2016

(65) Prior Publication Data
US 2017/0318705 A1    Nov. 2, 2017

(30) Foreign Application Priority Data
Nov. 17, 2014  (DE) ............... 10 2014 116 792.9

(51) Int. Cl.
*H05K 7/20* (2006.01)
*F24F 7/10* (2006.01)
(Continued)

(52) U.S. Cl.
CPC ....... *H05K 7/20745* (2013.01); *F24F 3/0442* (2013.01); *F24F 7/013* (2013.01);
(Continued)

(58) Field of Classification Search
CPC .............. H05K 7/20745; H05K 7/20836
See application file for complete search history.

(56) References Cited

U.S. PATENT DOCUMENTS

| | | | | |
|---|---|---|---|---|
| 5,050,667 A | * | 9/1991 | Berner | .................... F24F 7/065 165/137 |
| 6,672,955 B2 | | 1/2004 | Charron | |

(Continued)

FOREIGN PATENT DOCUMENTS

| | | |
|---|---|---|
| DE | 20 2004 003 309 U1 | 8/2004 |
| EP | 1 488 305 B1 | 10/2008 |

(Continued)

OTHER PUBLICATIONS

International Search Report dated Feb. 26, 2016 for Application No. PCT/EP2015/076827.
(Continued)

*Primary Examiner* — Kenneth M Lo
*Assistant Examiner* — Jonathan Michael Skrzycki
(74) *Attorney, Agent, or Firm* — Ladas & Parry LLP; Malcolm J. MacDonald

(57) ABSTRACT

A method and an arrangement for air-conditioning a cold aisle which is partially bounded by heat-generating devices and is arranged in a hot room, the hot room being separated from a second room by a boundary wall, and a region of the boundary wall is formed by a heat exchanger, such that air that is conveyed through the heat exchanger by the fan is supplied to the cold aisle. An opening with a fan is provided in the boundary wall. The cold aisle is connected to the boundary wall so that the opening is surrounded by the cold aisle.

18 Claims, 2 Drawing Sheets

Figure 1:
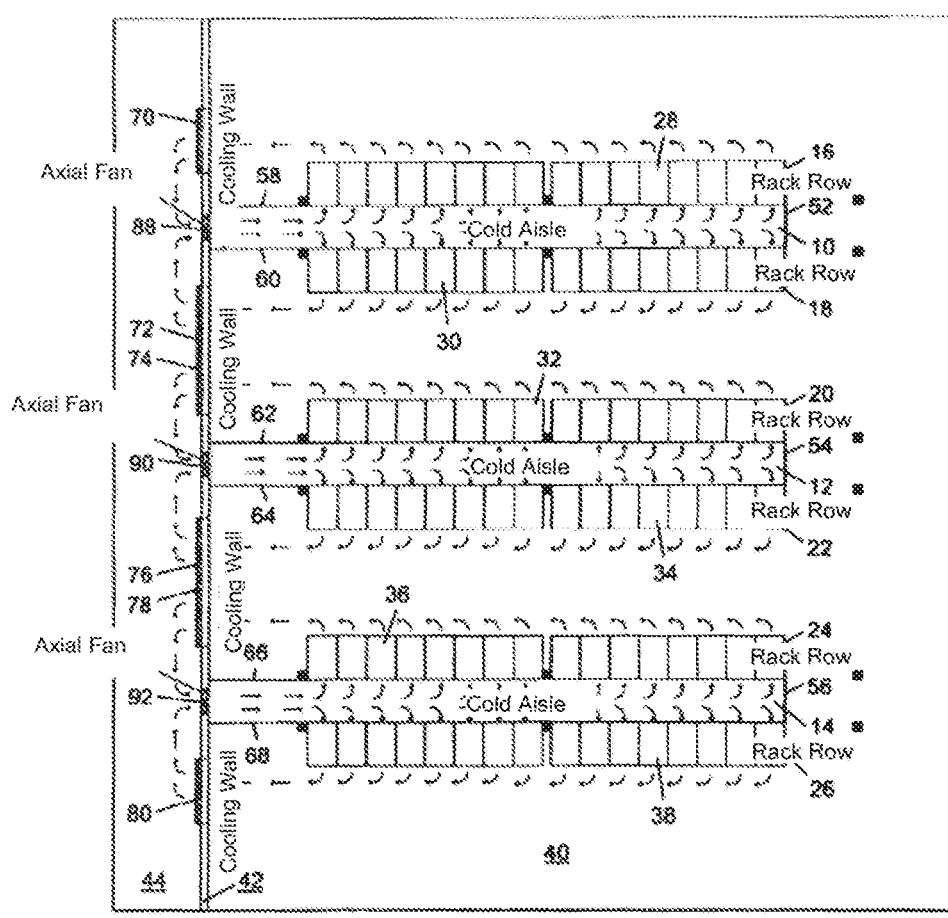

(51) Int. Cl.
*F24F 7/04* (2006.01)
*F24F 7/013* (2006.01)
*F24F 3/044* (2006.01)
*F24F 11/00* (2018.01)

(52) U.S. Cl.
CPC ............... *F24F 7/04* (2013.01); *F24F 7/10* (2013.01); *F24F 11/0001* (2013.01); *H05K 7/20836* (2013.01)

(56) References Cited

U.S. PATENT DOCUMENTS

| | | | |
|---|---|---|---|
| 8,031,468 B2 | 10/2011 | Bean, Jr. et al. | |
| 9,320,177 B2 * | 4/2016 | Levesque | H05K 7/20836 |
| 9,801,312 B2 * | 10/2017 | Kondo | H05K 7/20836 |
| 2004/0099747 A1 * | 5/2004 | Johnson | H05K 7/20736 |
| | | | 236/49.3 |
| 2011/0209852 A1 * | 9/2011 | Enlund | H05K 7/20745 |
| | | | 165/104.11 |
| 2012/0063082 A1 * | 3/2012 | Chang | G06F 1/206 |
| | | | 361/679.47 |
| 2013/0062047 A1 * | 3/2013 | Vaney | H05K 7/20836 |
| | | | 165/287 |
| 2015/0305196 A1 * | 10/2015 | Saita | H05K 7/2079 |
| | | | 361/692 |

FOREIGN PATENT DOCUMENTS

| | | |
|---|---|---|
| EP | 2 835 715 A1 | 2/2015 |
| JP | 2009-293851 A | 12/2009 |
| JP | 2011-220665 A | 11/2011 |
| WO | 2006/124240 A2 | 11/2006 |
| WO | 2013/056787 A1 | 4/2013 |

OTHER PUBLICATIONS

Espacenet English abstract of DE 10 2009 053 527 A1.
Espacenet English abstract of EP 2 278 231 A2.
Espacenet English abstract of DE 10048877 A1 which corresponds to DE 200 23 882 U1.
Espacenet English abstract of DE 20 2004 003 309 U1.
English translation of DE 10 2010 016 077 A1 which corresponds to DE 20 2009 002 033 U1.
Espacenet English abstract of JP 2011-220665 A.
Espacenet English abstract of EP 2 568 793 A2.
Espacenet English abstract of JP 2009-293851 A.
Espacenet English abstract of JP 2011-85267 A.
Espacenet English abstract of EP 2 501 214 A2.

* cited by examiner

METHOD AND ARRANGEMENT FOR AIR-CONDITIONING A COLD AISLE

The invention relates to a method for air-conditioning at least one cold aisle that is at least partially bounded by heat-generating devices in a hot room, in which the hot room is separated from a second room by means of a boundary wall, and at least one region of the boundary wall is formed in part as a cooling wall by means of at least one heat exchanger, wherein air that is conveyed through the at least one heat exchanger by means of at least one fan is supplied to the at least one cold aisle.

The invention also refers to an arrangement for air-conditioning at least one enclosed cold aisle that is arranged in a hot room and is connected fluidically via at least one fan to a second room that is separated from the hot room by at least one boundary wall embodied in part as a cooling wall, the fan being connected on the exhaust side to the at least one cold aisle and on the intake side to the hot room, via at least one heat exchanger that forms a portion of the boundary wall.

EP 2278231 A2 discloses an arrangement for air-conditioning a room. Here, a heat exchanger is formed as a room boundary or as a portion of a room boundary. Below the room is a hollow space through which the air that has been cooled by means of the heat exchanger is supplied to the room. This allows the room to be cooled in an energy-efficient manner At the same time, trouble-free maintenance of the heat exchanger is provided, since the heat exchanger is bounded on one side by the room that contains the heat-generating devices and on the side that faces away from the room by a maintenance passage.

DE 10 2009 030 214 A1 and DE 200 23 882 U1 disclose air-conditioning arrangements in which air flows through openings in a raised hollow floor into a room to be air-conditioned, in order to cool heat-generating devices that are present in the room, exclusively in recirculation mode.

From U.S. Pat. No. 6,672,955 B1 a data center is known, in which electronic devices arranged in rows are bounded by hot and cold aisles. The cold aisles are enclosed to allow cooled air to be supplied to them via an elevated floor. The air flowing through the electrical devices is then drawn off in the ceiling area and then passes through a heat exchanger through which a cooling fluid flows.

According to DE 20 2004 003 309 U1, computers are cooled by being arranged in a double-walled, cylindrical computer housing which has air inlet openings, through which cooling air flows to cool the computers. The heated air is then discharged via an air duct in which a fan is arranged. The exhaust air can be either discharged as outgoing air or recirculated, in which case it passes through a cooling device and is then resupplied to the room in which the computer housing is located.

In EP 1488305 B1, cooled air is supplied to devices arranged in a cabinet, and is drawn off via a fan arranged in an air conditioning unit. A heat exchanger is located in the flow path to the fan in the air conditioning unit.

For cooling a room in which computers are arranged in rows, DE 200 23 882 U1 specifies arranging an air-conditioning cabinet in the room and arranging a fan in a raised hollow floor space, with the fan being used to draw the exhaust air through the air-conditioning cabinet and then supply the inlet air back to the room via an opening in the floor.

DE 20 2004 003 309 U1 discloses a method for cooling a computer cluster, in which exhaust air is either discharged as outgoing air from a cylindrical room surrounded by computers or is supplied to an air conditioning unit.

The subject matter of WO 2006/124240 A1 is a cooling arrangement for computers, in which a heat exchanger is arranged in an intermediate room.

In US 2004/0099747 A1, a separate air conditioning unit is arranged in a computer room.

From DE 20 2009 002 033 A, an arrangement for air-conditioning a room is known. An air-conditioning unit to which outside air and/or exhaust air can be supplied is arranged on a wall.

The subject matter of DE 10 2011 117 908 B4 is a cooling arrangement for cooling electronic devices arranged inside control cabinets in a room. In the room containing the devices, two rectangular tower-like heat exchange cabinets are located, which have heat exchangers on at least two vertical side surfaces. The cabinet is disposed on a raised-access floor with openings, to which cooled air emerging from the heat exchange cabinet is supplied to the room. Below the cabinet, in the raised-access floor, a radial fan for blowing the cooled air can be arranged.

Alternatively, the radial fan may be positioned above the cabinet or inside the cabinet near its top.

An air-conditioning system is disclosed in JP 2011-220 665 A. In this system, warm air is drawn off near the ceiling and then passes through the heat exchangers, which form portions of a boundary wall of the room.

EP 2568793 A2 relates to a method and an arrangement for air-conditioning a room. In this case, fans are arranged below hot aisles in a hollow space; the fans draw in warm air, which is either supplied to heat exchangers or discharged as outgoing air.

From JP 2009-293 851 A, a cooling arrangement for cooling a room is known, in which heat exchangers are arranged between racks to cool the warm air that is produced.

In a cooling arrangement according to DE 10 2011 117 988 B1, rectangular tower-like heat exchange cabinets are used which have heat exchangers on at least two vertical side surfaces.

For conditioning air, JP 2011-085 267 A likewise specifies housings with heat exchangers, which are arranged between racks.

In U.S. Pat. No. 8,031,468 B2, a housing with cooling units is provided above a hot aisle.

EP 2501214 A2 discloses an arrangement for air-conditioning cold aisles that are located in a hot room. The hot room is separated from a second room by means of a wall, the wall being embodied in part as a cooling wall formed by one or more heat exchangers. The air flowing through the heat exchanger is supplied to a raised hollow floor, in which fans that are used for supplying the cooled air to the cold aisles are located.

A cooling circuit for use in a data center is known from WO 2013/056787 A1. Heat-generating components arranged in racks are positioned on a raised hollow floor. The racks delimit a cold aisle, to which cooled air is supplied via the raised hollow floor. Fans that are required for this purpose are located either within the raised hollow floor or in the cold aisle. Portions of the raised hollow floor may be embodied as heat exchange surfaces.

Arrangements of the prior art that enable the efficient cooling in particular of computer rooms typically have a raised hollow floor with openings, through which either cooled air can be supplied to the room or warm air can be drawn from the room. The cold aisles themselves extend spaced from the walls that delimit the room. The fans are typically radial fan.

The object of the present invention is to further develop a method and an arrangement of the type described in the introductory portion so as to enable cold aisles to be cooled in a highly energy efficient manner, while minimizing the pressure losses induced by the fans that are used. Good flow conditions should also be obtained.

To achieve the object, it is essentially proposed in terms of a method to provide at least one opening in the boundary wall, to which opening the at least one fan is assigned or in which said fan is disposed, and to connect the at least one cold aisle to the boundary wall in such a way that the opening is surrounded by the enclosed cold aisle or by a connection thereto.

In contrast to the generic prior art, the at least one cold aisle, and preferably a plurality of cold aisles, proceed directly from the boundary wall (in the following also referred to simply as the wall) of the hot room, which wall is embodied in part as a cooling wall, and the warm air flows through the cooling wall, which is formed by heat exchangers, into the second room, which is partitioned off by the wall, and is then drawn in by means of the at least one fan that is assigned to the at least one cold aisle, with the exhaust side of the fan extending on the cold aisle side. For this purpose, it is provided in particular that the fan is integrated into the opening provided in the wall such that the exhaust side of the fan, embodied in particular as an axial fan, is immediately adjacent to the cold aisle.

If an extension or some other type of connection to the cold aisle extends outward from the cold aisle and surrounds the opening with the fan, this is likewise considered a direct connection between the cold aisle and the boundary wall.

The teaching according to the invention requires no raised hollow floor. Furthermore, axial fans with large fan impellers can be used, resulting in high energy efficiency.

The heat exchangers that form the cooling wall are provided in the areas of the wall not covered by the cold aisles, which are bounded by the heat-generating devices arranged in rows. In other words, warm air can be drawn in over the entire heat exchanger surface.

The cold aisles themselves are enclosed in such a way that the cooled air flowing into the cold aisles essentially flows exclusively through the heat-generating devices or through the racks or frames holding these devices, and is then drawn out of the hot room surrounding the cold aisles via the heat exchangers.

The cold aisles are enclosed, in other words, the head and the end wall opposite the boundary wall of the hot room are closed, so that as mentioned above, the cooled air supplied to the cold aisle is forced to flow through the racks. The end wall may also be formed by one or more racks, of course.

Either way, the advantages known from the prior art are preserved, as both the heat exchanger(s) and the fan(s) can be easily accessed from the second room, characterized as a maintenance passage, allowing maintenance to be performed easily on both. If the cooling surface extending on the hot room side includes a filter, this must of course be maintained from the hot room side.

The invention is therefore characterized in that in the boundary wall at least one opening is provided, to which at least one fan is assigned or in which at least one fan is disposed, and in that the at least one cold aisle is connected to the wall such that the opening is surrounded by the enclosed cold aisle or by the extension or the connection thereto, more particularly in that a plurality of cold aisles are disposed in the hot room, and each cold aisle surrounds or is assigned to at least one opening existing in the wall and having at least one fan.

It is further provided that regions of the boundary wall that extend between the cold aisles and outside of the rows that contain the heat-generating devices and that bound the cold aisles are formed at least in part as a heat exchanger surface, that is to say, as a cooling wall.

It is preferably provided that the fan is at least partially recessed into the wall, that is to say, integrated therein.

It is also within the scope of the invention, in particular, for two second rooms, separated by two boundary walls, to be assigned to the hot room, with at least one opening to which at least one fan is allocated being provided in each wall, and with a cold aisle being arranged within the hot room in such a way that each of the at least one openings is connected to the cold aisle, in particular to the end faces thereof, and thus cold air is introduced from opposite ends. The walls themselves are embodied according to the features that have been described above.

Notwithstanding the above, it is provided in particular that the cold air is supplied to the cold aisle at a flow velocity at which a dynamic pressure p of $p \leq 10$ Pa prevails in the region of the heat-generating device that is closest to the opening, or of the frame that holds said device.

To ensure that the cold air in the region of the heat-generating device that is closest to the opening or of the frame that holds said device has sufficient velocity v to ensure the flow of said air through the frame, v should be $\leq 5$ m/s, preferably v should be $\leq 4$ m/s. For this purpose, according to a refinement of the invention, the cross-section of the cold aisle may be adjusted accordingly. For instance, the cold aisle may be provided with hoods extending at its head end, which produce a corresponding cross-sectional enlargement. The cross-section in this context is understood as the area that extends parallel to the boundary wall which contains the opening.

An arrangement of the type described at the outset is characterized in particular by the fact that the fan is arranged in an opening in the boundary wall or is fluidically connected thereto, and by the fact that at least one region of one side, in particular one end face, of the at least one cold aisle is delimited by a portion of the boundary wall within which the opening extends.

In contrast to prior art solutions, the cold aisle proceeds directly outward from the wall that delimits the hot room and is formed in part as a cooling wall; the racks that bound the cold aisle need not be directly adjacent to the wall; instead, the cold aisle may be extended by closed boundaries that close off the corresponding region on all sides, ensuring that cooled air will continue to flow exclusively over the racks into the hot room.

An extension also includes other types of connections between the cold aisle and the boundary wall that are designed to surround the opening with its assigned fan.

The invention further provides that regions of the wall that extend between longitudinal sides of adjacent cold aisles are embodied at least in part as a cooling wall by integrating one or more heat exchangers therein.

To achieve a desired cooling power, it is provided in particular that a plurality of openings or fans are provided within the end face of the cold aisle that is closed off by the portion of the wall. This also provides the possibility of a redundant design.

An axial fan, in particular, is used as the fan. However, it would still be within the scope of the invention for another type of fan to be used.

Notwithstanding the above, it is also possible for the hot room to be separated from two second rooms by two boundary walls, preferably opposite walls, for at least one opening with at least one fan assigned thereto to be provided in each of the walls that extends from the floor from which the cold aisles proceed, and more particularly extends perpendicular to said floor, and for each of the openings to be connected to the at least one cold aisle, more particularly for each end face of the cold aisle to surround one of the openings in the walls.

Additional details, advantages and features of the invention will be apparent not only from the claims and the features specified therein—alone and/or in combination—but also from the following description of preferred embodiments illustrated in the set of drawings.

The drawings show:

FIG. 1 a plan view of an arrangement for air-conditioning cold aisles, and

Figure 2:
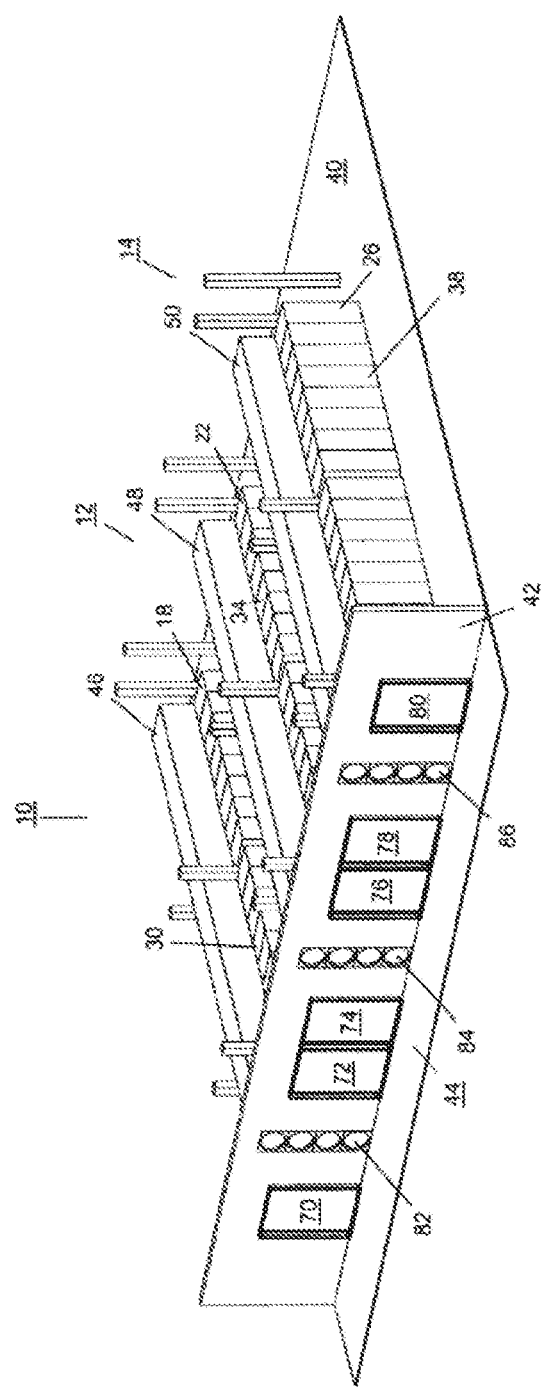

FIG. 2 the arrangement of FIG. 1 in a partially cut away perspective view.

In the figures, cold aisles 10, 12, 14 are illustrated in basic form, and are delimited by rows of racks 16, 18 and 20, 22 and 24, 26, respectively, some of which are denoted purely by way of example by the reference numerals 28, 30, 32, 34, 36, 38. The racks 28, 30, 32, 34, 36, 38 contain heat-generating devices that are to be cooled. For this purpose, conditioned air, i.e. cooled air, is supplied to the cold aisles, and is conducted exclusively through the racks or the heat-generating devices arranged in these, such as servers or other computers, as indicated by the arrows in FIG. 1.

Cold aisles 10, 12, 14, the longitudinal sides of which are bounded by rows 16, 18 and 20, 22 and 24, 26, respectively, are located in a first room characterized as a hot room 40, which is separated from a second room 44, which may also be designated as a maintenance room or maintenance passage, by at least one boundary wall 42 proceeding from the floor 41 of the hot room 40 and extending in particular vertically or perpendicular to the floor 41.

The cold aisles 10, 12, 14 that proceed from the floor 41 of the hot room 40 are enclosed, i.e. as mentioned, the cooled air flowing into the cold aisles 10, 12, 14 is able to flow only through the racks 28, 30, 32, 34, 36, 38 and into the hot room 40. For this purpose, the area between the rows 16, 18 and 20, 22 and 24, 26 is closed off from the hot room 40. For this purpose, a hood-shaped panel 46, 48, 50 which is U-shaped in cross-section extends on the top side between the rows 16, and 20, 22 and 24, 26, thus covering or sealing off the cold aisles 10, 12, 14 at the top, with each such enclosure—like the cold aisles 10, 12, 14—being closed off at the remote or outwardly facing end face in relation to the boundary wall 42. In the plan view of FIG. 1, the corresponding closed end faces are denoted by reference signs 52, 54, 56.

As is clear from the diagram of FIG. 1, rows 16, 18, 20, 22, 24, 26 do not extend up to the boundary wall 42, even where this might be possible. In the exemplary embodiment, cold aisles 10, 12, 14 are extended beyond rows 16, 18, 20, 22, 24, 26 in the direction of boundary wall 42 by panels 58, 60, 62, 64, 66, 68 as partitions, which form a substantially tight seal against the wall 42 so that the desired supply of cold air into cold aisle 10, 12, 14 is ensured. The regions bounded by partitions 58, 60, 62, 64, 66, 68 thus form portions of the cold aisles 10, 12, 14, with each set of partitions 58, 60 and 62, 64 and 66, 68 that extends one cold aisle 10, 12, 14 being respectively closed off at the head end by one of hoods 46, 48, 50. The figures are self-explanatory in this regard.

As is clear from the drawings, openings 70, 72, 74 are provided in boundary wall 42; these openings are surrounded by the front edges of the cold aisles 10, 12, 14 or of partition walls 58, 60, 62, 64, 66, 68 or of hoods 46, 48, 50, extending up to the wall, as is unmistakably clear in particular from FIG. 1.

In the openings 70, 72, 74, fans are arranged, which in FIG. 1 are denoted by reference signs 88, 90, 92. As is clear from FIG. 2, it is also possible for multiple fans to be arranged one above the other in each opening 82, 84, 86. For this purpose, the fans may extend outward from a support which is mounted in the opening 82, 84, 86 or is connected thereto. It is also possible for multiple openings to be arranged one above the other, with each opening being assigned a fan.

If the respective fan 88, 90, 92 is located as preferred within the opening 82, 84, 86 or extends at least partially through said opening, it may also be connected in a different way to the respective opening 82, 84, 86. What is essential is that air that has been cooled by a fan 88, 90, 92 is supplied to the cold aisle 10, 12, 14 to which that fan is assigned.

According to the invention, the exhaust side of each fan 88, 90, 92 is therefore connected to the cold aisle 10, 12, 14 to which it is assigned. The intake side of each fan 88, 90, 92 is connected to the second room 44 or extends within this room in order to thereby draw warm air in from the hot room 70 through the heat exchangers 70, 72, 74, 76, 78, 80, so that it can be cooled by the heat exchangers 70, 72, 74, 76, 78, 80 and can then be returned as cool air to the cold aisles 10, 12, 14.

Arranging the fans 88, 90, 92 at the cold aisle end makes it possible to use axial fans, which are connected on the exhaust side to the cold aisles 10, 12, 14. On the intake side, fans 88, 90, 92 extend outward from the second room 44, which is designated as a maintenance room.

Axial fans, which offer low pressure losses and large fan impellers, may be used with high energy efficiency and large-area heat exchangers to supply cooled air to the cold aisles 10, 12, 14. Optimal flow conditions are thereby obtained.

The result is high cooling output with minimal installation space required, in particular due to the fact that sufficient space is provided for the fans, which offers a significant advantage over arrangements in which the fan is disposed in a raised hollow floor or double floor, as is generally provided in the prior art. Arranging the fans in the wall, or arranging the mounts for the fans on the wall, results in narrower widths of the maintenance room, i.e. the second room 44, as compared with arrangements in which the fans are located in the floor region of the hot aisle and are fluidically connected to a raised hollow floor.

The result is a system configuration with coordinated individual elements, in which a problem-free installation of the individual modules is enabled. Ease of maintenance is provided by the fact that the components that are required for cooling, i.e. the fans 88, 90, 92 and the heat exchangers 70, 72, 74, 76, 78, 80, are accessible from the maintenance passage, that is, the second room 44.

No special designs are required; instead, available and proven standard technology may be used.

Although the drawing shows the end face of each cold aisle 10, 12, 14 meeting boundary wall 42 and surrounding opening 82, 84, 86, it is also possible, of course, for the cold aisle to be attached to wall 42 and surrounding opening 82, 84, 86 by a connection that is a continuation of a longitudinal side.

Furthermore, it is not essential for the cold aisles to be closed off by hoods at the head end. Instead, a cover may be provided directly on the racks, so that the height of the cold aisles corresponds to that of the racks.

The hood-shaped panels 46, 48, 50 serve to enlarge the cross-section of cold aisle 10, 12, 14 in order to ensure that the flow velocity of the cold air being supplied is ≤5 m/s, in particular ≤4 m/s, in the rack located closest to the respective opening, that is, in the heat-generating devices arranged in said rack. This ensures that the cold air will penetrate throughout the rack and will not be simply drawn through it.

It should further be noted that, according to a refinement not shown in the drawings, cold air may be fed to each cold aisle from each end face thereof. In that case, the hot room is separated from two second rooms by two boundary walls, with each cold aisle being connected at each end to the wall that faces that end, and surrounding an opening that includes at least one fan or to which at least one fan is assigned. In terms of the drawing, in this configuration, a boundary wall corresponding to boundary wall 42 shown on the left in FIG. 1 would also extend on the right, with conditioned air flowing through openings in this second wall into the respective cold aisle 10, 12, 14.

It is not necessary for boundary wall 42 to be straight, of course, rather it may be composed of multiple sections that do not necessarily have to be in alignment with one another.

The invention claimed is:

1. A method for air-conditioning a cold aisle that is at least partially delimited by rows of racks containing heat-generating devices, comprising:
   arranging the cold aisle in a hot room having a floor, the hot room being separated from an adjacent room by a single boundary wall extending perpendicular to the floor, the single boundary wall delineating the hot room from the adjacent room;
   arranging a heat exchanger in the single boundary wall, so that a region of the single boundary wall is a cooling wall;
   disposing a fan in an opening in the single boundary wall adjacent to the heat exchanger, so that an exhaust side of the fan is connected to the cold aisle;
   conveying air through the opening and into the cold aisle using the fan;
   wherein the opening is arranged on a longitudinal axis of the cold aisle;
   and wherein the cold aisle is connected to the single boundary wall in such a way that the opening is surrounded by the cold aisle.

2. The method of claim 1, comprising:
   arranging a plurality of openings in the single boundary wall;
   disposing a fan with in each of the plurality of openings;
   and arranging a plurality of cold aisles in the hot room, such that each one of the plurality of cold aisles surrounds one of the plurality of openings.

3. The method according to claim 2, wherein a region of the single boundary wall between adjacent cold aisles that extends outside of the cold aisles comprises a heat exchange surface.

4. The method according to claim 1, wherein the fan is an axial fan.

5. The method according to claim 1, wherein the fan is partially recessed into the single boundary wall.

6. The method according to claim 1, further comprising:
   separating the hot room from a second adjacent room by a second single boundary wall delineating the hot room from a second adjacent room;
   associating a first fan with a first opening in the single boundary wall; and
   associating a second fan with a second opening in the second single boundary wall;
   wherein a first end face of the cold aisle surrounds the first opening; and
   wherein a second end face of the cold aisle surrounds the second opening.

7. The method according to claim 1, wherein the air is supplied to the cold aisle at a flow velocity sufficient to ensure a dynamic pressure p of p≤10 Pa in a region of the heat-generating device that is closest to the opening, or in a region of a frame that holds the heat-generating device.

8. The method according to claim 1, wherein a cross-section of the cold aisle is configured such that the flow velocity v of the cold air being supplied to the cold aisle is v≤5 m/s in a region of the heat-generating device that is closest to the opening, or in a region of a frame that holds the heat-generating device.

9. An arrangement for air-conditioning a cold aisle delimited by rows of racks containing heat-generating devices, comprising:
   a hot room having a floor, and being fluidically connected via a fan to an adjacent room that is separated from the hot room by a single boundary wall extending perpendicular to the floor, and delineating the hot room from an adjacent room,
   wherein the fan is fluidically connected on an exhaust side of the fan to the cold aisle, and on an intake side of the fan to the hot room via a heat exchanger which forms a portion of the single boundary wall,
   wherein the fan is disposed in an opening in the single boundary wall, so that an exhaust side of the fan is connected to the cold aisle,
   and wherein a region of one end of the cold aisle, or a connection to said cold aisle, is delimited by a portion of the single boundary wall within which the opening extends.

10. The arrangement according to claim 9, wherein an end face of the cold aisle is delimited by a portion of the single boundary wall that contains the opening.

11. The arrangement according to claim 9, wherein regions of the single boundary wall that extend between longitudinal sides of a plurality of adjacent cold aisles are at least partially formed by one or more heat exchangers.

12. The arrangement according to claim 9, comprising a plurality of fans disposed in a plurality of openings.

13. The arrangement according to claim 12, wherein the plurality of openings is arranged in a vertically extending row.

14. The arrangement according to claim 9, further comprising:
   a second adjacent room separated from the hot room by a second single boundary wall delineating the hot room from a second adjacent room;
   a first fan associated with a first opening in the single boundary wall;
   a second fan associated with a second opening in the second single boundary wall;
   wherein a first end face of the cold aisle surrounds the first opening; and
   wherein a second end face of the cold aisle surrounds the second opening.

15. The method according to claim 8, wherein v≤4 m/s.

16. The arrangement according to claim 14, wherein the single boundary wall and the second single boundary wall are opposing boundary walls.

17. The method according to claim 1, wherein a longitudinal axis of the cold aisle is arranged perpendicularly to the single boundary wall.

18. The arrangement according to claim 9, wherein a longitudinal axis of the cold aisle is perpendicular to the single boundary wall.

* * * * *